United States Patent
Vernon

(10) Patent No.: US 6,331,711 B1
(45) Date of Patent: Dec. 18, 2001

(54) CORRECTION FOR SYSTEMATIC, LOW SPATIAL FREQUENCY CRITICAL DIMENSION VARIATIONS IN LITHOGRAPHY

(75) Inventor: Matthew F. Vernon, Los Gatos, CA (US)

(73) Assignee: Etec Systems, Inc., Hayward, CA (US)

( * ) Notice: Subject to any disclaimer, the term of this patent is extended or adjusted under 35 U.S.C. 154(b) by 0 days.

(21) Appl. No.: 09/369,771

(22) Filed: Aug. 6, 1999

(51) Int. Cl.[7] .................................................. G21G 5/00
(52) U.S. Cl. ............................................................ 250/492.2
(58) Field of Search ................................... 430/296, 269, 430/206; 250/492.2, 492.22

(56) References Cited

U.S. PATENT DOCUMENTS

| | | | |
|---|---|---|---|
| 5,103,101 | * 4/1992 | Berglund | 250/492.2 |
| 5,279,925 | * 1/1994 | Berger | 430/296 |
| 5,382,498 | * 1/1995 | Berger | 430/296 |
| 5,703,376 | * 12/1997 | Jensen | 250/492.22 |
| 5,773,836 | 6/1998 | Hartley . | |
| 5,916,424 | * 6/1999 | Liggy | 250/492.22 |
| 5,916,716 | 6/1999 | Butsch et al. . | |
| 5,998,085 | * 12/1999 | Isberg | 430/200 |
| 6,069,684 | * 5/2000 | Golladay | 430/269 |

* cited by examiner

Primary Examiner—Jey Tsai
Assistant Examiner—André C Stevenson
(74) Attorney, Agent, or Firm—Jung-hua Kuo

(57) ABSTRACT

In scanning lithography as used in the semiconductor industry, systematic variations in critical dimension feature size which depend on the substrate coordinates are compensated for in a lithography tool. This is done by determining (experimentally or theoretically) low frequency variations in the critical dimensions on the target caused by imperfections in the lithography tool and/or the resist and/or the process steps. These low frequency spatial errors are compensated for, after the primary scanning exposure using the original pattern data, by a secondary scanning exposure of the target using a weaker intensity and relatively larger diameter exposure beam. The secondary exposure is also carried out at a larger address size (address grid) than is the primary exposure so it is relatively fast in terms of throughput. Since the secondary exposure is additive to the more intense primary exposure, relative critical dimension control is provided in fine increments but with relatively minor adverse impact on throughput and thus fabrication cost. Thus the detected systematic variation defects are compensated for without requiring the primary exposure to be performed at a smaller address size.

11 Claims, 3 Drawing Sheets

CORRECTION FOR SYSTEMATIC, LOW SPATIAL FREQUENCY CRITICAL DIMENSION VARIATIONS IN LITHOGRAPHY

FIELD OF THE INVENTION

This invention relates to lithography and more specifically to a method and apparatus for correcting variations in features formed by scanning lithography where the variations are measurable and of low frequency and are dependent on the feature's location on the substrate.

BACKGROUND

Lithography is a well known field and includes both electron beam and photolithography. A typical application of lithography is for defining patterns onto photo or electron sensitive resist coated on a substrate The substrate is typically a semiconductor wafer or a reticle blank for semiconductor fabrication. The lithography process defines a pattern on the resist which is then developed and used for subsequent etching or other steps. Lithography includes using a reticle (mask) in which a beam of for instance light is directed through a mask which defines the pattern in order to image the pattern onto the substrate; and also scanning where a beam, for instance of electrons or light, is directed in a raster or vector scan onto the resist. The scanned beam is turned on and off in order to expose or not expose various portions of the resist.

In lithography an important goal is uniformity of each instance of an identical feature defined by the lithography process. The features are the elements imaged onto the substrate. There can be systematic variations in feature sizes that are determined by the feature's location on the substrate and which arise from a variety of causes. To simplify this description, it will refer to the feature as the critical dimension with the smallest tolerance for deviation from the designed value.

Sources of such systematic variations are, for instance, imperfections in the "optical" components (optical lenses or electrostatic/electromagnetic lenses) of the lithography machine ("tool") that contribute to the intra-field uniformity of features; resist sensitivity at different positions on a substrate caused for example by inhomogeneities of the baking process which typically occurs after exposure or after the application of resist; and radial inhomogeneities from variations in resist thickness and/or induced by process steps such as resist development or chrome etching. Since it is to be understood (see above) that scanning lithography is typically used not only to fabricate semiconductor devices by direct writing, but also to fabricate the reticles used in photolithography, the problems with such variations are essentially the same in both cases.

It is known that a reproducible low spatial frequency variation dependent on the substrate location in critical dimension features can be caused by the above described effects. After these low frequency "signatures" have been characterized, for instance by experimentation, it is possible to compensate for the resulting error in the image by modifying the pattern (image) data. This modifying the pattern data of course is only available in the beam write (scanning) lithography regime mentioned above, where the data is the information defining the pattern which is used to control the scanning. Unfortunately because the pattern data is generally not radially symmetric and the pattern grid (the raster or vector scan grid) is not commensurate with the systematic critical dimension variation, correction for such low frequency errors requires selecting a finer (smaller) data address grid. For a raster scan system, this causes the write times to increase proportionately to the inverse square of the ratio of the data address grids.

To better explain this, consider as an example a reproducible radial variation in critical dimensions observed experimentally from the center to the edge of a mask (for use in semiconductor fabrication) which is being written, for instance, by electron beam lithography. Assume the largest differences in critical dimensions observed from the radial variation are 50 nanometers (nm) the original data address grid (spacing between pixel which define the pattern) is 30 nm and the goal is to have no more than a 10 nm radial error in critical dimension features. To meet this average error criteria, the data would have to be refractured on a 10 nm grid, with the pattern data vertices adjusted appropriately to compensate for the radial effect. Ignoring the (additionally adverse) increase in the number of geometrical figures created by the radial perturbation to the pattern data the exposure time would increase nine $(30 \text{ nm}/10 \text{ nm})^2$ times due to the reduction of the data address grid size alone.

In other words, it would take at least nine times longer to write such a mask given the finer address grid when compensating for a radial error. This very substantial reduction in throughput is undesirable since it increases fabrication cost proportionately. The reference to the geometrical figures is that typically physical features written on a mask are divided into a number of sub-shapes, for instance, squares, rectangles, etc. for ease of data processing. This further division would increase the number of figures required to describe all patterns which now depend on their location of the substrate. In other words, the data must be redescribed as a single pattern for the substrate.

This brute force approach to overcoming the above-mentioned systematic variations is not economical and hence unsatisfactory. It would be better to compensate for such errors without refracturing the data and therefore substantially increasing the fabrication time. It is to be understood that the technical problem here expressed in terms of patterning a mask also applies to direct writing of features on a wafer or other substrate.

SUMMARY

In accordance with this invention, in a scanning (raster or vector) lithography tool a relatively weak intensity diffuse secondary exposure beam (typically of electrons or light) is used to modify the main scanning exposure of the target in small dose increments, dependent on the positional coordinates of the target carrying the resist to be exposed. This approach can be implemented on lithography scanning exposure tools which use either light or charged particle (e.g., electron) exposure systems and is independent of the lithography tool pattern generator architecture, that is whether it is raster or vector scan.

Because the exposure from the secondary weaker intensity beam is additive to the more intense primary exposure, relative critical dimension control can be made in fine increments. The secondary exposure beam is typically Gaussian, i.e., of lower intensity at its edges than at its center. Through selection of the intensity and spot size of the secondary exposure, sub-nanometer relative critical dimension increments are possible. Because the effects to be compensated for, as described above, change slowly over the area of the target substrate, the secondary exposure can be efficiently performed at a large address grid size which is independent of the pattern address data. This secondary exposure corrects for the above-noted variations without requiring the primary exposure to be done at a smaller data address. This overcomes the above-mentioned throughput problem with the prior art brute force approach. Thus to the extent that critical dimension uniformity is critical to crevice performance and low frequency spatial errors associated with the location on the target substrate are identified as being systematic, this method efficiently compensates for these errors. This allows cost reductions for a given minimum critical dimension error.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

The following describes embodiments in accordance with this invention, directed to, e.g., mask making, or wafer fabrication using direct writing, but not so limited. First, in one embodiment it is assumed that the dependence of the systematic critical dimension uniformity errors on the target substrate coordinates described above can be approximated mathematically, for instance by a polynomial expressed in the target substrate surface plane coordinates, e.g., in x and y or r (radius). That is, the critical dimension errors are location dependent in a known way over the surface area of the target substrate, typically a mask blank or a semiconductor wafer. Use of a polynomial is not required, however the polynomial case: is readily illustrated herein.

In this method, based on the empirically determined change in critical dimension with a small change in exposure dose of the nominal exposure dose of the particular resist formulation in use (a value which is known), a combination of the address, spot size and intensity of the exposure beam are selected for the secondary diffuse exposure that provides the smallest critical dimension increment desired. Typically this secondary exposure is performed after the primary exposure but that is not required; it may be performed beforehand or even simultaneously, although that would require a non-conventional lithography tool. Typically the primary exposure is first performed conventionally and the secondary exposure, in accordance with this invention, performed second using the same lithography tool with suitable adjustments to the address grid, and beam spot size and intensity.

Figure 1:
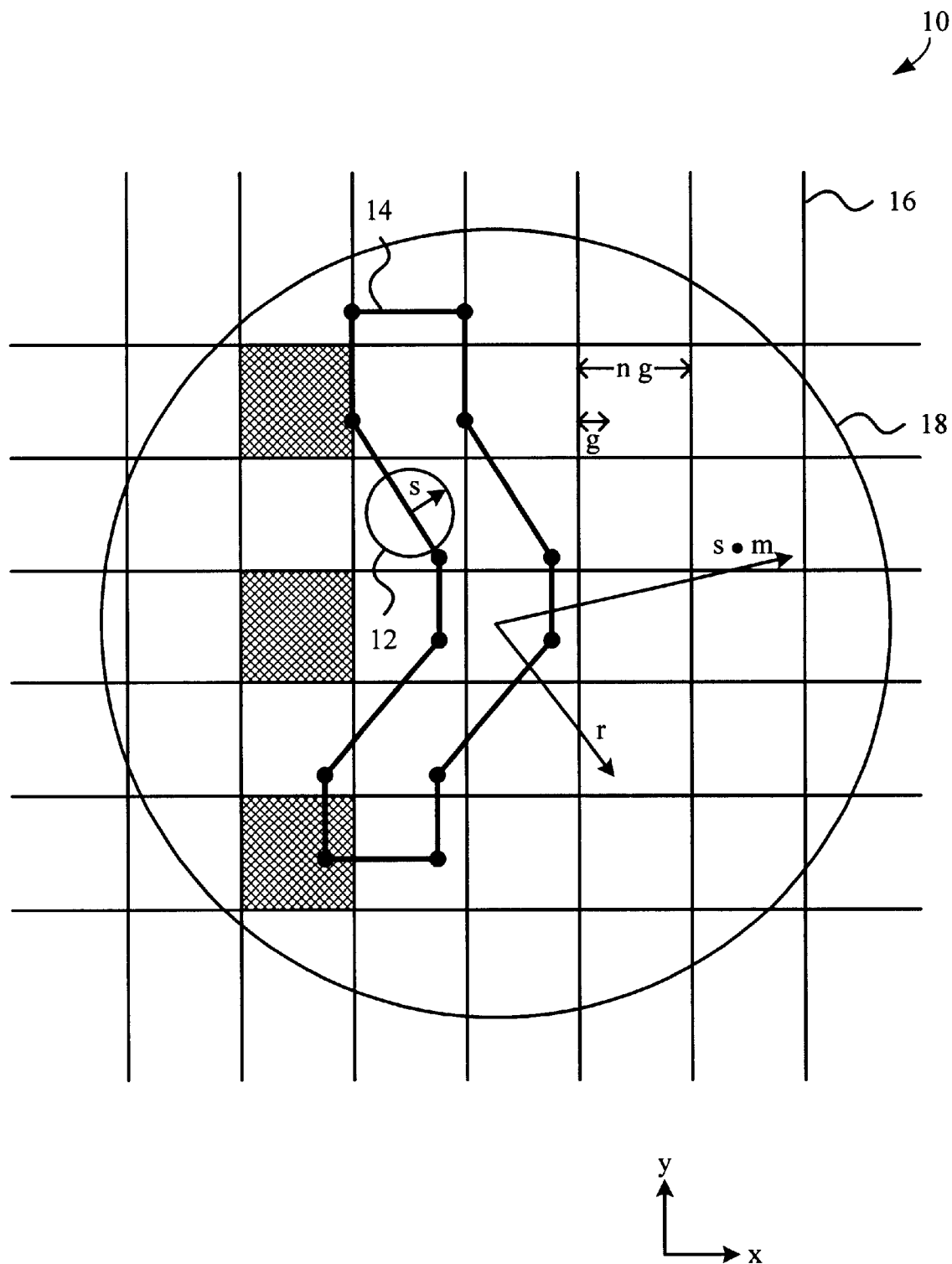
FIG. 1 shows diagramatically in a plan view a method in accordance with this invention.
Figure 2:
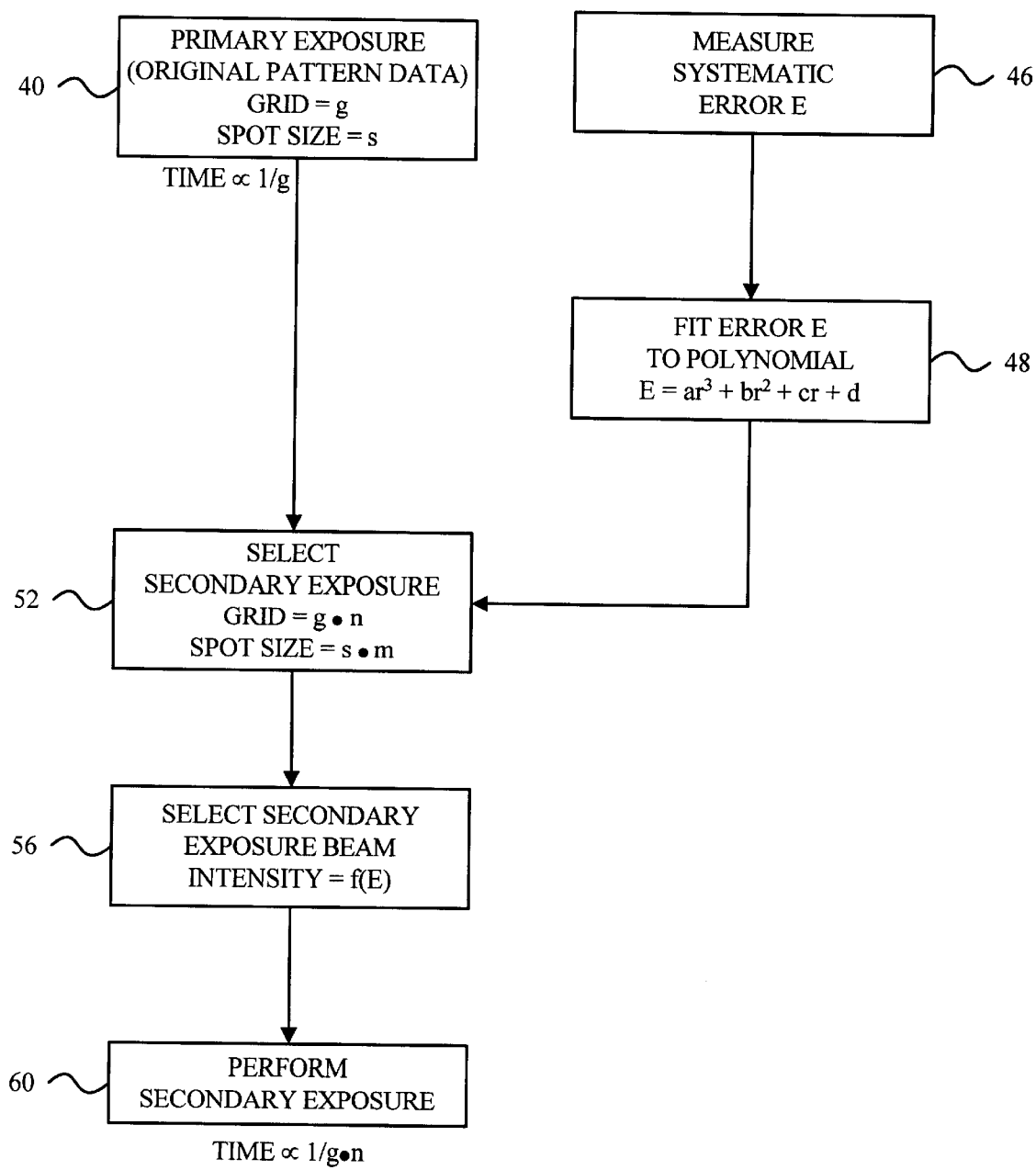
FIG. 2 shows a flow chart for the FIG. 1, method.

The present method is illustrated diagramatically in FIG. 1 and shown in a flow chart in FIG. 2. It is to be understood that this method uses a conventional lithography tool, for instance an electron beam or light (laser) beam system for writing of a pattern onto a target substrate which is, e.g., a mask or a semiconductor wafer. FIG. 1 shows a plan view of part of a surface of substrate 10 being written (patterned) by an incident beam 12 (e.g., an electron or laser beam shown in cross section), to define pattern 14 (e.g., a transistor gate electrode.)

First, at step 40 (FIGS. 2) a conventional primary raster or vector scan exposure by beam 12 is made of the substrate 10 using the lithography tool at the fine address grid size g. (The grid 16 is assumed to be symmetric in the x and y directions.) This exposure images the original pattern data which defines the various features (including feature 14) to be written onto the target substrate 10. The pattern data is conventionally expressed in the form of pixels (picture elements) arranged in a grid 16 (see FIG. 1) with even spacing g between pixel centers. (For clarity, only every 4th grid position is shown by the grid lines.) A particular beam 12 spot size (diameter) is selected, here denoted s. The time required to write the primary exposure pattern (for raster or vector scanning) is proportional to $1/g^2$. Step 40 is wholly conventional.

Independently (typically "off line" and prior to the primary exposure), by experimentation engineers working with the lithography tool measure systematic error by exposing at least one test resist-coated substrate similar to substrate 10 using the lithography tool and measuring the systematic error in the size of critical dimensions at various locations on the patterned substrate, after all processing steps have been completed. In the event that systematic, intra-field critical dimension errors associated with the imaging of a mask pattern onto a wafer are to be corrected, the systematic error function would be derived for measurements of critical dimension features on the processed wafers. These wafer measurements would be transformed to the mask substrate coordinates and allowance made for the reduction factor (if any) of the system that images the mask onto the wafer substrate.

The pattern written on the test substrate is, e.g., a test pattern of a set of crosses characteristic of the critical dimension sizes desired placed at multiple locations of the mask substrate so to sample the mask substrate coordinates where the correction is desired. This measures any systematic error present. Alternatively the systematic error is determined theoretically by calculation. However, this requires an ability to mathematically model the error, which may not be available. The actual sources of the error are of no particular importance since it is assumed only that they are systematic to the lithography tool, starting materials, and processing steps used to manufacture the photomask and/or patterned wafers. Therefore the test substrate (mask or wafer) is exposed under circumstances as close as possible to those for production substrates. This provides accurate measurement of the systematic error.

After measurement of the systematic error (at a number of points on the experimental substrate) the set of measured error values is fitted to a polynomial equation. The polynomial equation is expressed, as described above, in terms of the x, y coordinates on the substrate and/or radial distance from the center of the target substrate (or a portion thereof). Systematic error that is a function of radius is, e.g., due to resist being spun on or various boundary effects. This radial error case is somewhat easier to explain. In this illustrative case the measured error $E = ar^3 + br^2 + cr + d$ (a third degree polynomial) where a, b, c, and d are constants and r is the radial distance from the center of the target substrate (see FIG. 1.).

This polynomial of course is only suitable for a radial error and not for one which has another type of variation Instead of r, one could use the x, y coordinates (see FIG. 1) for a two variable polynomial. The polynomial need not be of the third degree but could be of greater or lesser degree that provides a reasonably good fit to the measured (experimentally determined) error. Conventional polynomial fitting algorithms are used; these determine both the polynomial degree and constants. In one embodiment, the fitted polynomials are localized to particular portions of the target substrate surface, so several polynomials would be used to correct for error over the entire surface of the target.

The systematic critical dimension error dependence on substrate location $E(x,y)$ is then converted to the required correction dose. The effect of the secondary dose on the critical dimension can be determined empirically. First, a number of instances of the test pattern are created using the standard primary exposure. Second, individual instances of these patterns are exposed with distinct secondary doses. The test mask or wafer is then processed and the critical dimensions measured. The dependence of the measured critical dimensions on secondary dose is then determined. Again, this dependence can be described by a polynomial $D(\Delta CD)=a_0+a_1 (\Delta CD)+a_2(\Delta CD)^2+ \ldots$ where D is the secondary dose required to change the critical dimension by the amount $\Delta CD$ and $a_0, a_1, a_2 \ldots$ are the fitted coefficients. Finally, the polynomial representing the substrate position dependency of the critical dimension error $E(x,y)$, is used as the argument to the polynomial D creating the correction dose to be applied at each substrate location (x,y) Hence, $D(x,y)=a_0+a_1 (E(x,y))+a_2 E(x,y))^2+ \ldots$ represents the secondary correction dose at each substrate coordinate.

Next in step 56, the secondary exposure is performed to apply the correction dose D(X,Y) to the substrate. In this case, the original (primary exposure) grid size (pixel pitch) is 30 nm and the secondary exposure grid size is 120 nm. The original (primary exposure) beam diameter is 90 nm and the secondary exposure beam diameter is 1200 nm. The time required for the secondary exposure is proportional to $1/n^2$ relative to that of the primary exposure where n=(secondary grid size)/(primary grid size), i.e., 30 nm/120 nm)$^2$=1/16. If the secondary exposure dose, D(x,y), can be achieved with the desired accuracy by a larger secondary exposure grid, then the secondary exposure time will be smaller.

The particular details of how accurately and quickly the secondary dose D(x,y) can be applied are dependent on the particular architecture of the lithography tool. For a "gray" beam architecture where the dose applied at each writing pixel can be independently adjusted, the secondary exposure can be done in the same manner as a primary exposure. For an exposure tool which can only apply one fixed dose for "on" writing pixels, it is possible to deliver the secondary dose D(x,y), by using a spot size for the secondary exposure which is large compared to the secondary grid writing size.

For example, if the secondary spot diameter is four times the secondary grid writing size, the total secondary dose at a given location will have contributions from approximately 16 neighboring writing pixels. The net dose will then be approximately equal to the number of these 16 writing pixels that are "on" allowing the total secondary dose to be adjusted in increments of 1/16 of the full secondary exposure. The secondary exposure pattern can be created by computing the secondary exposure doses D(x,y), every four secondary writing pixels. Next, one determines the number of the 16 pixels centered at the sampled pixel to be turned on to deliver the desired collection dose at the sampled pixel. These 4×4 bit maps which deliver the desired dose at the center of the sampled pixels will create the desired secondary exposure pixel map for those lithography tools that can deliver only one dose for "on" pixels.

This particular ratio of secondary spot size to secondary grid is only illustrative. As the ratio of the secondary spot size to the secondary grid increases, smaller dose increments are possible. Since the dose error function D(x,y) varies slowly when measured in units of the secondary spot size, the contours of the dose error function can be accurately followed for lithography tools that deliver a single fixed dose for "on" pixels.

For the secondary exposure, the pattern memory of the lithography tool is loaded with the appropriate pattern based on the delivering the desired secondary correction dose D(x,y).

The original pattern data therefore does not need to be used to modulate the imaging of the critical dimension features over the target substrate to correct for the determined substrate position-dependent critical dimension systematic errors. In other words, the secondary exposure can be carried out at a much large address grid size than the primary exposure as shown in FIG. 1. This is possible due to the low spatial frequency of the systematic error being compensated for, and allows the secondary exposure to be done quickly.

Figure 3:
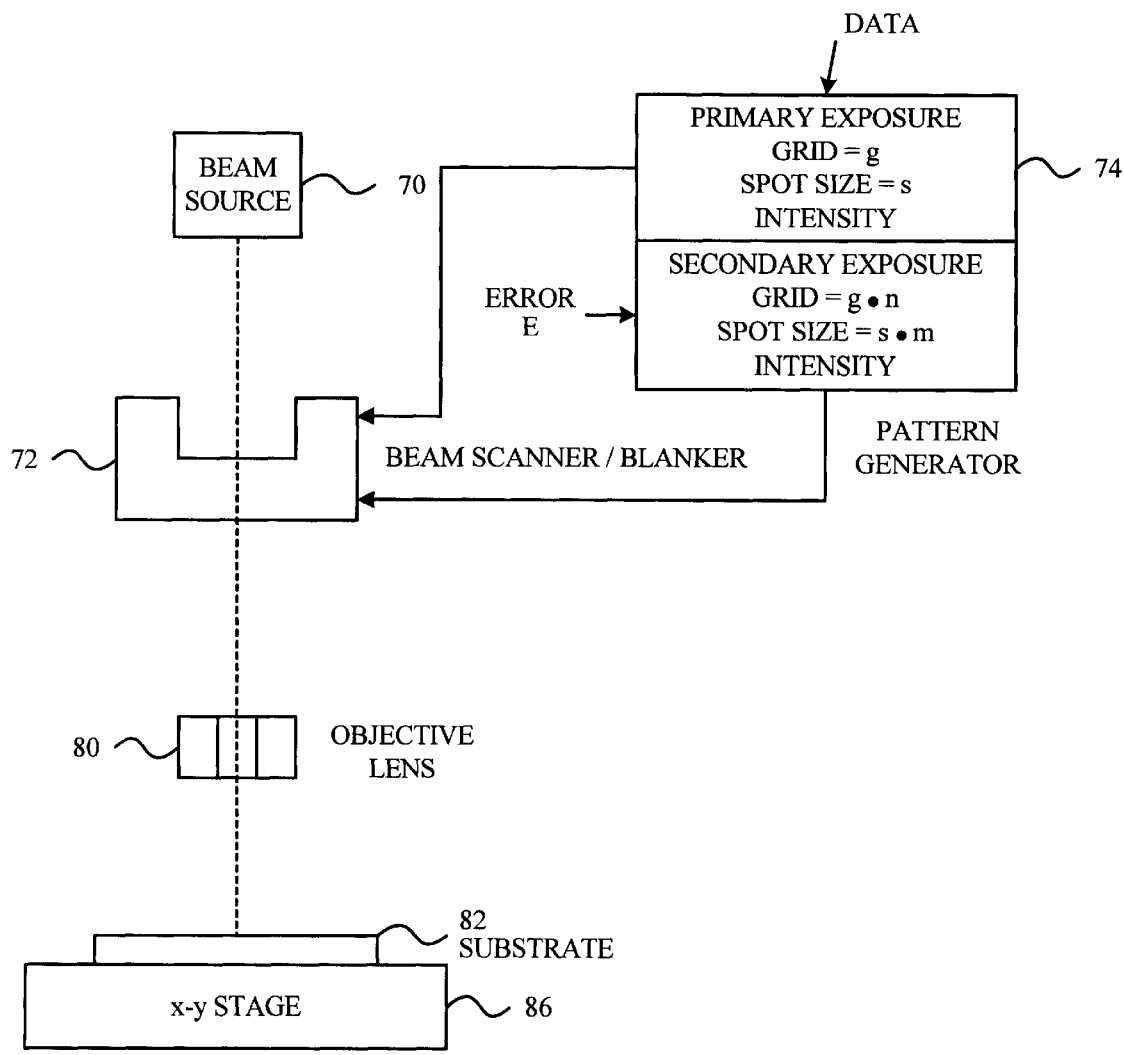
FIG. 3 shows a lithography tool for carrying out the FIG. 2, method.

FIG. 3 shows in a block diagram the main elements of a lithography tool to carry out the FIG. 2 method; all elements are conventional except for the data processing in the pattern generator. A beam source 70 (e.g., electron gun or laser) directs its beam through a beam scanner/blanker 72, which is optical (for a light beam) or electromagnetic/electrostatic (for an electron or ion beam). Pattern generator 74 receives the original pattern data and, for the primary exposures determines the grid size g, spot size s, and intensity for each pixel, and outputs suitable control signals to control scanner/blanker 72. The resulting beam, focused by objective lens 80, scans across target substrate 82 which is mounted on an x-y stage 86. The pattern generator 74, for the secondary exposure, generates suitable grid size, spot size, and intensity parameters and in response to the supplied systematic error values E, performs the secondary exposure by suitably controlling beam scanner/blanker 72.

The present approach is also compatible with conventional electron beam proximity correction ("ghost proximity") techniques (see, e.g., U.S. Pat. No. 4,988,284 issued Jan. 28, 1991, to Liu et al., incorporated herein by reference) used in scanning, where the proximity correction is performed with a diffuse beam. In this case, the above-described secondary exposure is performed by suitably altering the diffuse beam used for the proximity correction exposure.

This disclosure is illustrative and not limiting. Further modifications will be apparent to those skilled in the art in light of this disclosure and are intended to fall within the scope of the appended claims.

What is claimed:

1. A method of imaging a pattern on a sensitive substrate using a lithographic apparatus, comprising the acts of:
   determining selected dimensional variations in patterning by the lithographic apparatus;
   scanning the pattern onto the substrate using the lithographic apparatus at a predetermined addressing grid spacing;
   additionally scanning the substrate at an addressing grid spacing greater than in the act of scanning, and at a lower intensity that in the act of scanning, thereby correcting for the determined dimensional variations.

2. The method of claim 1, wherein the act of scanning comprises vector or raster scanning a beam across the substrate.

3. The method of claim 2, wherein the beam is of light or charged particles.

4. The method of claim 2, wherein a diameter of the beam in the act of additionally scanning is greater than in the act of scanning.

5. The method of claim 1, wherein the act of additionally scanning precedes the act of scanning.

6. The method of claim 1, wherein the act of determining comprises the act of determining theoretically or by experimentation.

7. The method of claim 1, wherein the dimensional variations are a function of location on the substrate.

8. The method of claim 7, wherein the function is of a radial location on the substrate.

9. The method of claim 1, wherein the act of determining comprises the act of expressing the function as a polynomial, and wherein the act of additionally scanning comprises the act of scanning in accordance with the polynomial.

10. The method of claim 1, wherein the addressing grid spacing for the act of additionally scanning is at least twice that of the addressing grid spacing for the act of scanning.

11. The method of claim 1, wherein the act of additionally scanning comprises the act of modulating an intensity of the exposure.

* * * * *